(12) United States Patent
Skoll et al.

(10) Patent No.: US 7,020,853 B2
(45) Date of Patent: Mar. 28, 2006

(54) DESIGN ANALYSIS WORKSTATION FOR ANALYZING INTEGRATED CIRCUITS

(75) Inventors: David F. Skoll, Ottawa (CA); Terry Ludlow, Ottawa (CA); Julia Elvidge, Ottawa (CA)

(73) Assignee: Chipworks, Ottawa ( * ) Notice: Subject to any disclaimer, the term of this patent is extended or adjusted under 35 U.S.C. 154(b) by 53 days.

(21) Appl. No.: 10/717,460

(22) Filed: Nov. 21, 2003

(65) Prior Publication Data

US 2004/0117750 A1 Jun. 17, 2004

Related U.S. Application Data

(60) Division of application No. 09/927,551, filed on Aug. 13, 2001, now Pat. No. 6,684,379, which is a continuation of application No. 09/690,813, filed on Oct. 18, 2000, now abandoned.

(51) Int. Cl.
*G06F 17/50* (2006.01)
(52) U.S. Cl. ............................................. 716/1; 716/11
(58) Field of Classification Search .................... 716/1, 716/4, 5, 11, 12; 382/144–145; 345/519–522, 345/964
See application file for complete search history.

(56) References Cited

U.S. PATENT DOCUMENTS

| 4,224,664 | A | * | 9/1980 | Trinchieri | 714/25 |
| 4,623,255 | A | | 11/1986 | Suszko | 356/389 |
| 5,086,477 | A | | 2/1992 | Yu et al. | 382/8 |
| 5,191,213 | A | | 3/1993 | Ahmed et al. | 250/310 |
| 5,561,293 | A | | 10/1996 | Peng et al. | 250/307 |
| 5,694,481 | A | | 12/1997 | Lam et al. | 382/145 |
| 6,288,393 | B1 | * | 9/2001 | Phaneuf et al. | 250/307 |
| 6,591,278 | B1 | * | 7/2003 | Ernst | 707/104.1 |
| 6,671,424 | B1 | * | 12/2003 | Skoll et al. | 382/305 |

FOREIGN PATENT DOCUMENTS

| CA | 2216589 | 9/1997 |
| CA | 2216900 | 9/1997 |

OTHER PUBLICATIONS

Article: Chip Scanner System High Resolution SEM Image Capture and conversion from image to GDS-11 layout, George Lanzarotta, Raith USA, Inc., Nov. 1999.

(Continued)

*Primary Examiner*—Paul Dinh
(74) *Attorney, Agent, or Firm*—Max R. Wood; Ogilvy Renault, LLP

(57) ABSTRACT

A design analysis workstation for performing design analysis of integrated circuits provides facilities for extracting design and layout information from digital image-mosaics captured during deconstruction of an integrated circuit. Each image-mosaic is displayed in at least one mosaic-view as a background image that is overlaid with at least one annotation overlay. An engineer analyst creates annotation objects on the annotation overlay based on information inferred concurrently from one or more image-mosaics. Concurrent display of a plurality of image-mosaics facilitates the understanding of interrelations between components on different layers. The design analysis workstation displays a plurality of cursors in respective views of mosaic-images, the cursors having lock-step motion to facilitate comprehension of the alignment of features on different concurrently displayed image-mosaics. The design analysis workstation provides facilities for performing operations on created annotation objects including grouping, cell definition, signal carrier creation, contact creation, signal propagation, net-list generation, etc. The advantages include annotation of image-mosaics using information derived from a plurality of concurrently displayed mosaic-views to facilitate tracing of interconnected busses and an understanding of interrelations between components.

13 Claims, 8 Drawing Sheets

OTHER PUBLICATIONS

Article "Computer-Aided Reconstruction of IC Layout from Image-Based Representation" C.C. Jong et al., Sep. 1993, Proceedings of the 5th International Symposium on IC Technology, Systems ADN Applications, Nanyang Technological University, Singapore.

Article: "Integrated Circuit Chip Layer Analysis", Tan Ooi Kiang et al., Sep. 1993, Proceedings of the 5th International Symposium on IC Technology, System and Applications, Nanyang Technological University, Singapore.

* cited by examiner

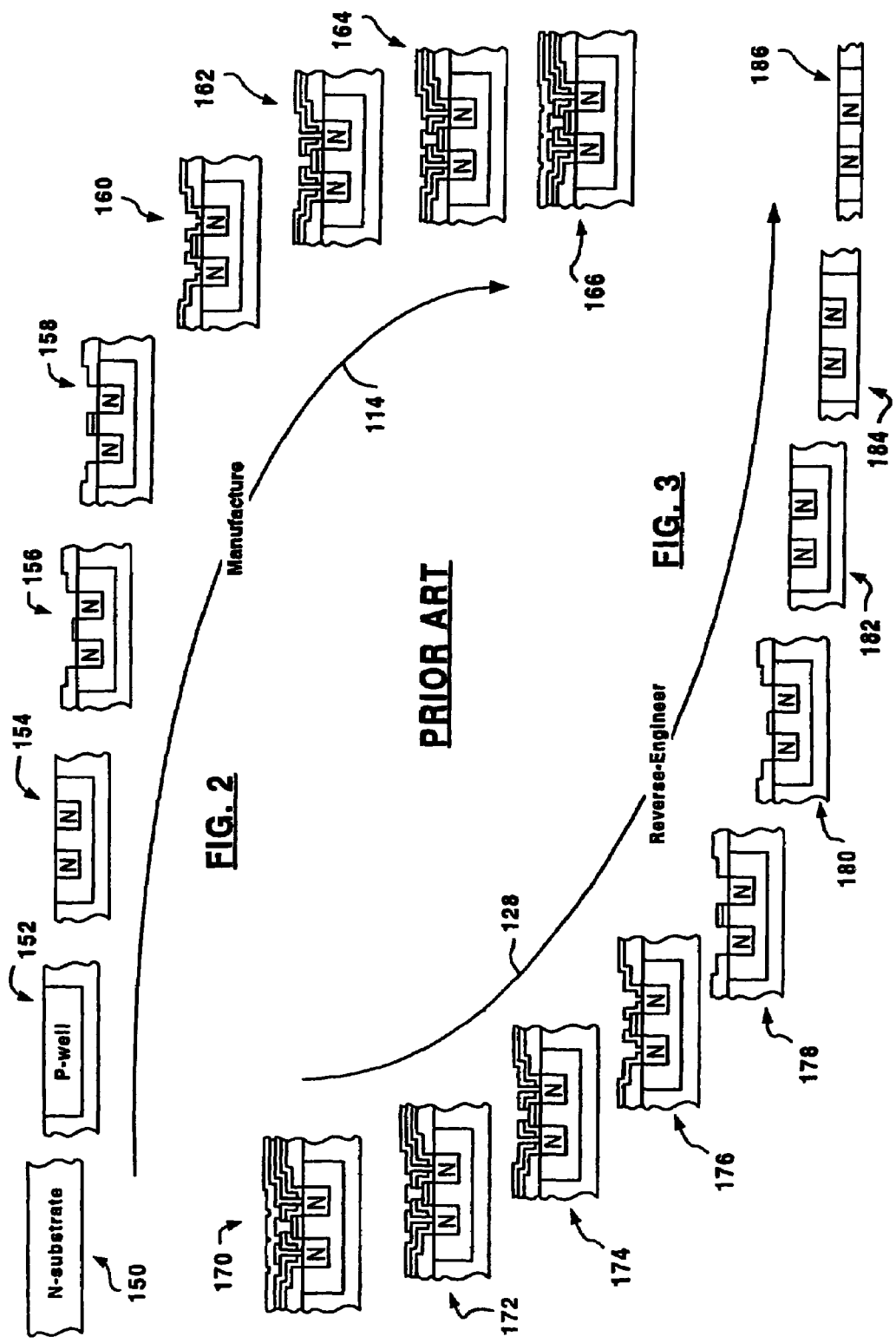

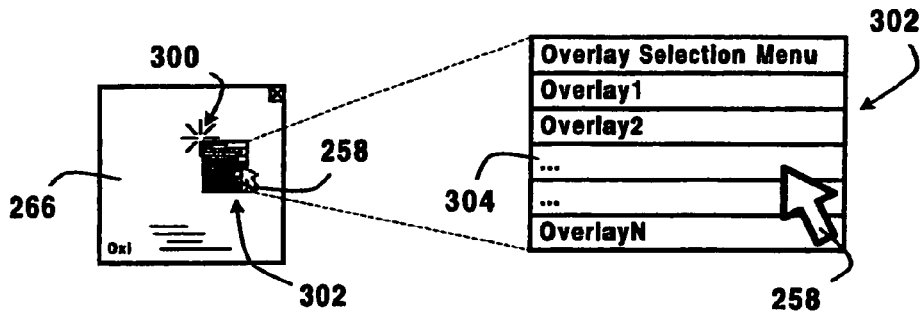
FIG. 7
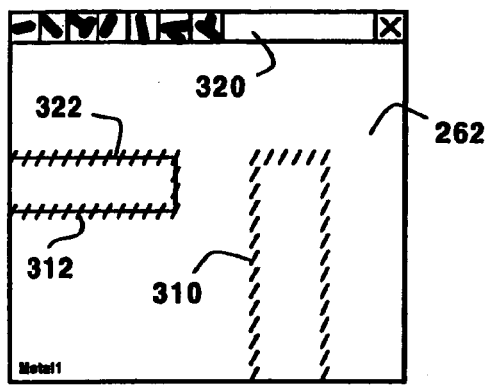
FIG. 8
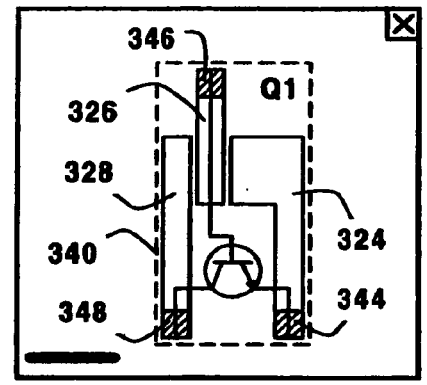
FIG. 10
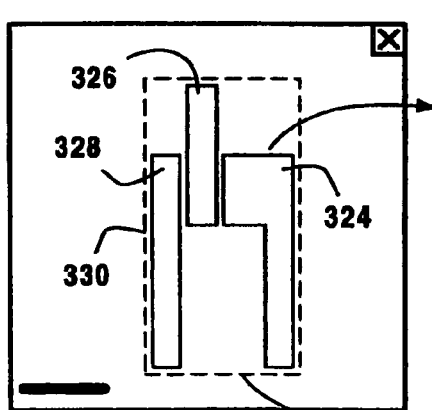
FIG. 9
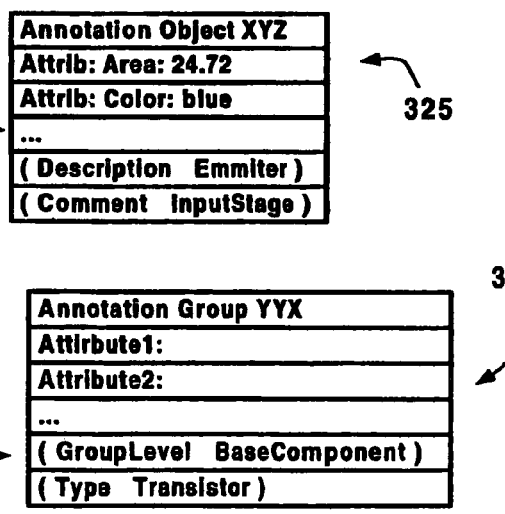

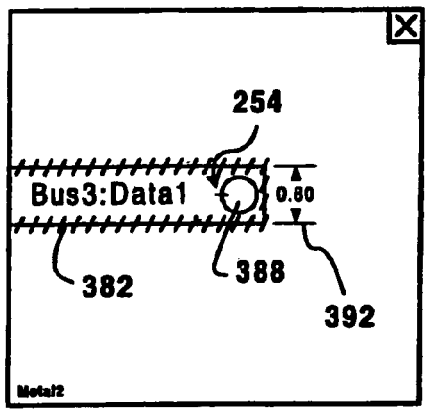 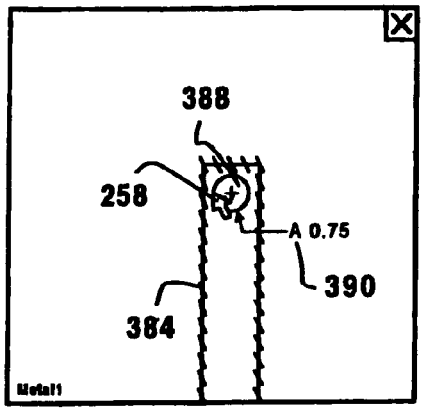
FIG. 11A   FIG. 11B
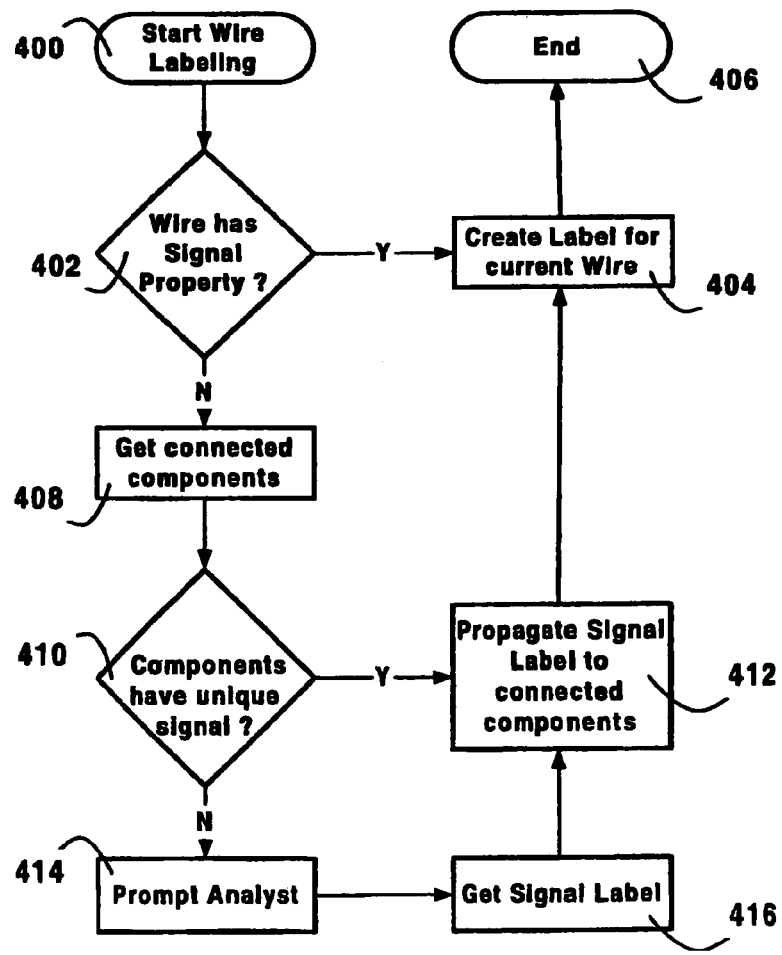
FIG. 12

DESIGN ANALYSIS WORKSTATION FOR ANALYZING INTEGRATED CIRCUITS

CROSS-REFERENCE TO RELATED APPLICATIONS

This application is a division of U.S. patent application Ser. No. 09/927,551 filed Aug. 13, 2001, now U.S. Pat. No. 6,684,379, which is a continuation of U.S. patent application Ser. No. 09/690,813, filed Oct. 18, 2000 and now abandoned.

TECHNICAL FIELD

The invention relates to the field of integrated circuit verification, and in particular to methods and apparatus for extracting design and layout information from integrated circuits.

BACKGROUND OF THE INVENTION

In the semiconductor industry it is often necessary to physically analyze semiconductor integrated circuits (ICs) for the purposes of product reliability assurance, design validation and identification of device structural patterns. ICs are analyzed to extract design and/or layout information therefrom. This process is known as reverse-engineering. Reverse-engineering is also part of the test and development process in the manufacture of ICs on a large scale. In general, a vast amount of time and manual labor is required to reverse-engineer an IC.

An IC is a monocrystalline silicon die upon which a large number of transistors and other electronic components have been fabricated and interconnected to form a useful circuit. During manufacture, each die is part of a larger silicon wafer substrate which facilitates handling and simultaneous processing of a plurality of ICs.

The IC fabrication process includes: doping the silicon substrate to change its conductive properties and building up a sequence of layers onto the silicon substrate using different techniques. Doping layers are created using ion implantation. Diffusion layers are created by depositing dopants on top of a substrate and heating the wafer. With each deposition layer, different materials are deposited and selectively removed by selective etching in accordance with a predetermined pattern. Components manufactured on the silicon wafer span multiple layers. Oxide layers are used for insulation. Deposited metal layers are used to interconnect individual terminals of the components so formed. It is the identification of these components and the interconnections provided by the metal layers that provides base information from which the design and/or layout of an IC can be extracted and verified.

In reverse-engineering a sample IC, the die is deconstructed. The IC sample die is subjected to a progressive layer-removal sequence utilizing an exacting series treatment, such as etchants, each of which is specifically chosen to remove a single layer at a time. Other deconstructing treatments include dry etching, polishing, etc. Using such treatments, interconnecting metal layers, polycrystalline silicon layers, oxide layers, etc. are removed step-by-step. At each step in the deconstruction of a chip, the surface of the partly deconstructed IC is inspected.

Inspection techniques include the use of: optical microscopes, scanning electron microscopes, and other surface inspection equipment. In general, the scanning electron microscope is accurate but is expensive to own and operate. Optical microscopes can be used in brightfield, contrast interference and darkfield modes of illumination. In the brightfield or contrast interference modes, the physical extents of the components on the die are distorted by fringe effects. These fringe effects can be interpreted by an experienced human analyst but require vast amounts of computation for analysis by a computer.

A METHOD OF EXAMINING MICROCIRCUIT PATTERNS is described in the U.S. Pat. No. 4,623,255 which issued Nov. 18, 1986 to Suszko. The method involves photographing an IC die in between deprocessing steps. Film transparencies are printed and used by an engineer analyst to extract design and layout information from the photographed IC. While the teachings of Suszko have merit, design and layout extraction are impeded by the handling and cross-correlation of the bulky transparencies.

Human enabled extraction of design and layout information from image-mosaics is lengthy. Other prior art methods concentrate on eliminating human input from the information extraction process by devising image analysis algorithms.

An AUTOMATED SYSTEM FOR EXTRACTING DESIGN AND LAYOUT INFORMATION FROM AN INTEGRATED CIRCUIT is described by Yu et al. in U.S. Pat. No. 5,086,477 which issued Feb. 4, 1992. A digital camera and a controlled stage are used to capture images in overlapping tile fashion after each deconstruction step. The captured digital images are stored in a computer memory and reassembled into image-mosaics based on the overlap at the borders of each tile image. Yu et al. describe pattern matching performed on an image-mosaic captured after a deconstruction step, and points out the difficulties involved in extracting layout information from the tile images. The automated system to Yu et al. appears to be suitable for extracting design information from complex ICs that are difficult to reverse engineer. To accomplish this, "cell" libraries are built. The cell libraries contain images of specific arrangements of components that are known to perform a specific function. The cell libraries are used for automated pattern matching in order to facilitate reverse engineering of Application Specific Integrated Circuits (ASICs), for example. However, Yu et al. fail to describe how multiple image-mosaics, each representing a different step in the deconstruction of an IC, are manipulated in order to extract design and layout information concurrently therefrom. Concurrent analysis of image-mosaics is desirable because individual components fabricated on the silicon wafer may span multiple layers.

Another prior art publication in PROCEEDINGS OF THE 5$^{TH}$ INTERNATIONAL SYMPOSIUM ON IC TECHNOLOGY, SYSTEM AND APPLICATIONS, SINGAPORE by Tan Ooi Kiang et al. entitled "INTEGRATED CIRCUIT CHIP LAYER ANALYSIS" (presented 15–17 Sep. 1993) describes a system for automatic layout extraction from IC's achieving a quoted 85% accuracy. The remainder of the extracted layout being left for completion by a human engineer analyst.

While such automated systems are ingenious, it is debatable whether such automated design and layout extraction methods are superior to or more economical than human driven processes.

There therefore is a need to provide improved methods and apparatus enabling an engineer analyst to extract design and layout information from image-mosaics in a time efficient, enhanced manner.

SUMMARY OF THE INVENTION

The invention therefore provides a design analysis workstation for analyzing an integrated circuit that has been deconstructed and a digital image-mosaic of the integrated circuit was acquired at each deconstruction step to permit design and layout information to be extracted therefrom. The design analysis workstation comprises means for displaying each image-mosaic in a corresponding mosaic-view; means for displaying an annotation overlay over an image-mosaic in at least one of the mosaic-views; and means for editing annotation objects associated with the annotation overlay.

Each of the image-mosaics is displayed in a respective mosaic-view as a background image to the annotation overlay. The annotation overlay has see-through properties to permit the annotation objects to be created and edited using information derived from at least one underlying image-mosaic. Each one of the annotation objects has associated attributes.

The design analysis workstation includes means for concurrently displaying a plurality of annotation overlays. The display of the plurality of image-mosaics displayed in a respective plurality of mosaic-views is synchronized. The means for synchronizing the display of the plurality of image-mosaics includes means for panning the plurality of image-mosaics by a specified distance that is the same for each image-mosaic. The means for synchronizing the display of the plurality of image-mosaics further includes means for zooming the plurality of image-mosaics by a specified zoom factor that is the same for each of the image-mosaics.

Annotation objects may be edited based on information derived from a plurality of image-mosaics displayed in respective mosaic-views. The editing is facilitated by a plurality of synchronized view-cursors respectively displayed in the plurality of mosaic-views. The synchronized view-cursors move in lock-step with a master-cursor displayed in a one of the mosaic-views. The master-cursor is controlled by a pointing device operatively associated with the design analysis workstation.

The design analysis workstation further comprises image-mosaic comparison means for comparing selected portions of image-mosaics displayed in a plurality of mosaic-views. The image-mosaic comparison means includes an image-mosaic comparison view displaying respective portions of the image-mosaics. Each mosaic-view includes an annotation overlay selector.

Annotation objects have a respective predetermined group of attributes. Each annotation object comprises at least one layer attribute. A wire annotation object comprises an associated layer attribute and signal carrying characteristics. The layer attributed associated with the wire annotation object may specify a layer different from the image-mosaic associated with the annotation overlay with which the wire annotation object is associated. A contact annotation object comprises two associated layer attributes, the contact annotation object specifying inter-layer connectivity using the two associated layer attributes.

An annotation object may also have annotation properties. Each annotation property is preferably editable. The annotation properties are preferably also extensible. The annotation properties may be, for example, key-value pairs.

The design analysis workstation provides means for performing operations on selected annotation objects and means for performing measurements of selected features of an image-mosaic. The means for performing measurements includes means for performing linear measurements and means for performing area measurements.

The design analysis workstation permits selected annotation objects to be aggregated into annotation object groups. The design analysis workstation provides means for associating properties with the annotation object group(s). The annotation properties associated with an annotation object group may override annotation properties associated with individual annotation objects aggregated into the annotation object group. An annotation object group may comprise a collection of at least two annotation object groups. An annotation object group further includes a cell specification. The cell specification specifies at least one port. A port of a cell has signal directionality. The signal directionality comprises any one of input signaling, output signaling and bi-directional signaling.

In accordance with the invention, there is further provided a system for extracting design and layout information from a plurality of image-mosaics representative of a deconstructed integrated circuit. The system comprises means for enabling parallel design analysis of the image-mosaics by a plurality of engineer analysts concurrently reverse engineering an IC. The plurality of image-mosaics are annotated concurrently using a plurality of design analysis workstations. Each one of the annotation objects created using a design analysis workstation participating in parallel design analysis includes an ownership attribute that specifies an engineer analyst associated with the design analysis workstation at a time when the annotation object was created. Each annotation object includes an identification string, and the system further comprises means for generating unique identification strings. Annotation objects having different ownership attributes can be merged for display on one design analysis workstation.

The invention further provides a method of analyzing the layout of a deconstructed circuit using a design analysis workstation, comprising a step of performing at least one edit operation on at least one annotation object associated with an annotation overlay superimposed over an image-mosaic captured after one step in deconstructing the integrated circuit, the image-mosaics being displayed in at least one of a plurality of concurrently displayed mosaic-views. Performing the edit operation on the annotation object comprises a step of creating the annotation object before the edit operation is performed. Creating the at least one annotation object may be accomplished by drawing at least one schematic. The design analysis workstation associates the created annotation object with an annotation overlay in which the operation to create the annotation object was started.

A wire annotation object may also be created. Wire annotation objects are associated with a layer. The wire annotation object represents a signal carrier. A connection annotation object may likewise be created. The connection annotation object is associated with first and second layers of the integrated circuit. The connection annotation object represents signal connectivity between other annotation objects.

Performing an edit operation on an annotation object may further comprise a step of modifying the annotation object. Modifying the annotation object may further comprise a step of associating the annotation object with an annotation overlay in which an edit operation that moved the annotation object ended. Modifying the annotation object may also comprise a step of associating the annotation object with an annotation overlay in which an edit operation that copied the annotation object ended. Modifying the annotation object may yet further comprise a step of hiding the annotation object from being displayed, in order to prevent accidental editing thereof. Modifying the annotation object may also comprise a step of locking the annotation object, to prevent further modification thereof.

The method further comprises a step of saving at least one annotation object independently of the annotation overlays associated with the respective image-mosaics. The method also comprises a step of loading the at least one saved annotation object independently of the annotation overlays associated with the respective image-mosaics. The method likewise comprises a step of selecting at least one annotation object for inclusion in a selection group. Selecting the at least one annotation object further comprises steps of: pointing at the at least one annotation object using a pointing device associated with the design analysis workstation; and manipulating one of the pointing device and at least one key of the design analysis workstation to select the at least one annotation object for inclusion in the selection group. Selecting the at least one annotation object for inclusion in the selection group may be performed using an annotation object search. Subsequent to selecting the at least one annotation object for inclusion in the selection group, the mosaic-views may be automatically panned or zoomed to display the selected annotation object(s).

Performing the edit operation on a selection group further comprises grouping selected annotation objects in the selection group to form an annotation object group. The method also comprises a step of performing at least one edit operation on the annotation object group. The method also comprises a step of undoing at least one edit operation performed on the at least one annotation object. Performing the edit operation further comprises a step of redoing at least one edit operation performed on the at least one annotation object.

The method in accordance with the invention also comprises steps of creating an annotation property, and associating the annotation property with the at least one annotation object. The method further comprises a step of editing the annotation property associated with the annotation object. The annotation property is preferably displayed in an annotation object information pop-up window. The annotation object information pop-up window may be configured to persist, pending an action to close the window.

The method further comprises a step of defining at least one cell for performing design and layout extraction. The cell comprises at least one annotation object. A cell may also include at least one annotation object group.

The present invention further provides a method of analyzing a design of a deconstructed integrated circuit using a design analysis workstation. The method comprises a step of propagating signal information from an annotation object having a signal property to at least one other connected annotation object. Signal information is propagated between a cell and a wire annotation object. The method also comprises a step of generating a net-list from interconnected cells.

Propagating signal information in accordance with the invention comprises steps of selecting all contact annotation objects connected to a wire annotation object, the wire annotation object and the contact annotation objects having at least one specified layer in common; and, propagating signal information from the wire annotation object to all annotation objects connected to the contact annotation objects. The method further comprises a step of detecting a logical short if two different signals are propagated to a given annotation object. On detecting the logical short, the method further comprises a step of displaying information about the logical short on the design analysis workstation.

BRIEF DESCRIPTION OF THE DRAWINGS

Further features and advantages of the present invention will become apparent from the following detailed description, taken in combination with the appended drawings, in which:

FIG. 2 is a process diagram showing an exemplary progression of steps in manufacturing a sample IC;

FIG. 3 is a process diagram showing an exemplary progression of steps in deconstructing a sample IC for reverse-engineering;

FIG. 7 is a schematic representation of a mosaic-view showing the selection of an annotation overlay to be displayed therein in accordance with an embodiment of the invention;

FIG. 8 is a schematic diagram illustrating a the creation of an annotation object in accordance with an embodiment of the invention;

FIG. 9 is a schematic diagram illustrating grouped annotation objects and displayed annotation object information in accordance with an embodiment of the invention;

FIG. 10 is a schematic diagram illustrating a derived cell in accordance with an embodiment of the invention;

FIGS. 11A and 11B are schematic diagrams illustrating two mosaic-views each displaying connected wire annotation objects in accordance with an embodiment of the invention;

FIG. 12 is a flow diagram showing a process of labeling wire annotation objects in accordance with an embodiment of the invention;

It will be noted that throughout the appended drawings, like features are identified by like reference numerals.

DETAILED DESCRIPTION OF THE EMBODIMENTS

The invention provides a design analysis workstation to facilitate the extraction of component and component interconnection informatiion from image-mosaics captured during the deconstruction of an integrated circuit. The design analysis workstation displays a plurality of image-mosaics concurrently in respective independent mosaic-views. The mosaic-views are synchronized to display the same area of the respective image-mosaics. Design information is extracted by recreating all or parts of the components and component interconnections as schematics drawn on one or more annotation overlays displayed over one or more of the mosaic-views.

Figure 1:
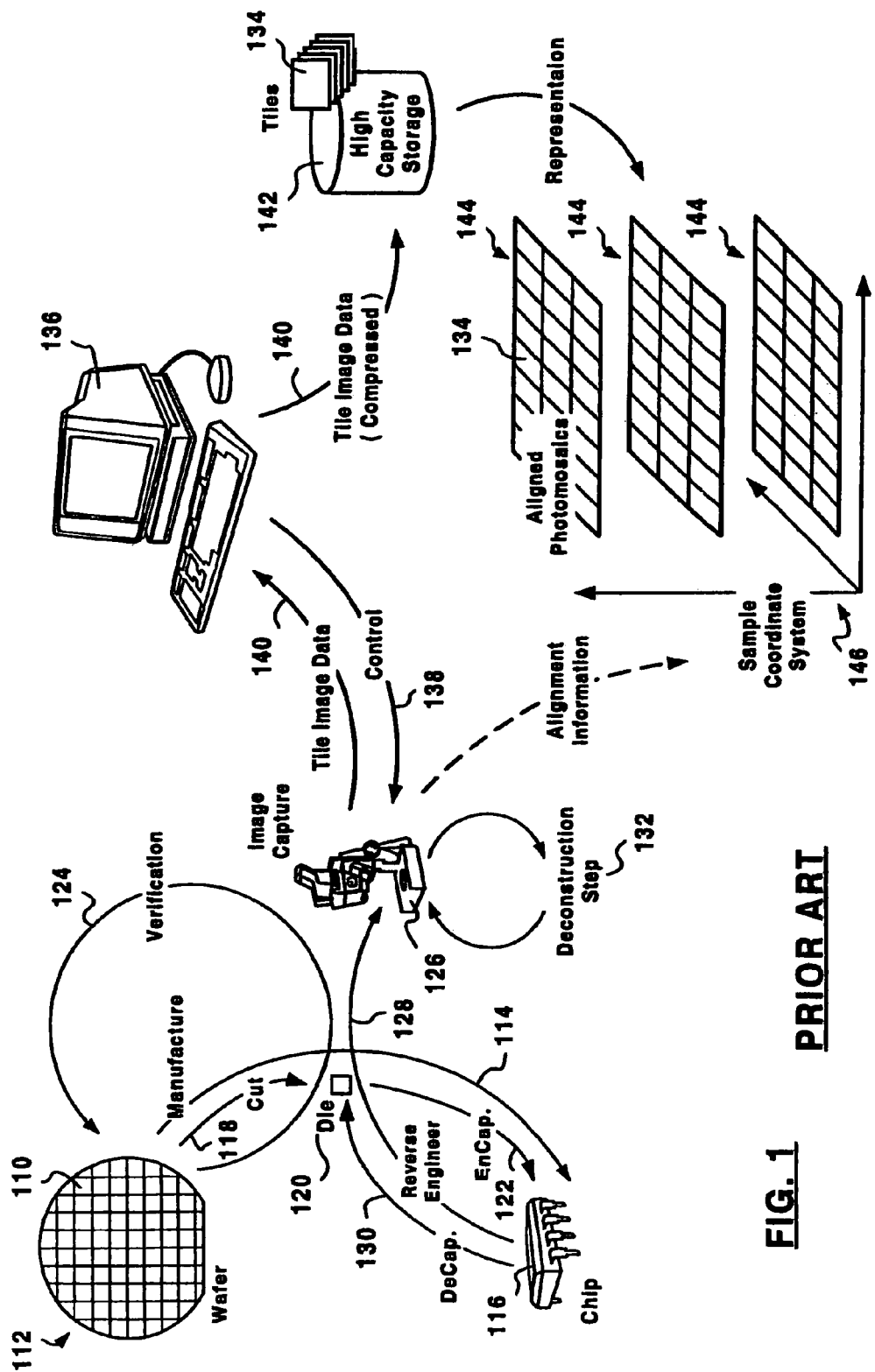
FIG. 1 is a work flow diagram showing an overview of an exemplary process by which image-mosaics representative of steps in a deconstruction of a semiconductor integrated circuit (IC) are acquired.

FIG. 1 is a work-flow diagram showing an overview of an exemplary prior art process by which image-mosaics representative of steps in the deconstruction of a semi-conductor integrated circuit (IC) are acquired. IC's 110 are fabricated on a wafer 112. The wafer 112 comprises a mono-crystalline silicon substrate which is a natural insulator. Doping the silicon substrate with other chemical elements can change the properties of the silicon, including making the silicon substrate a semi-conductor or a conductor. Such substrate processing is performed as part of a manufacturing process 114 of chip 116. In packaging a chip 116, a die 120 is cut in a step 118 from the wafer 112 and is encapsulated in step 122 to form the chip 116.

The reverse engineering of integrated circuits typically involves a process 124 by which wafers 112, cut dies 120, or portions thereof are inspected using a micro-imaging system 126 to extract design and layout information for design validation or purposes of competitive analysis.

For the purposes of product quality assurance or competitive analysis, for example, a process of reverse-engineering 128 is performed on the chip 116. A first step in the reverse-engineering process 128 is a decapsulation 130 of the chip 116 to remove the die 120. Die 120 is inspected using the micro-imaging system 126 to extract design and layout information. The micro-imaging system 126 may include high magnification optical microscopes, scanning electron microscopes, field emission electron microscopes, or the like. Design and layout extraction from a die 120 or portion thereof involves a process of deconstruction 132 by which layers formed during the manufacturing process 114 are removed step-by-step.

High magnification tile images 134 of the sample die 120 are acquired between each deconstruction step 132 under the control of a computer workstation 136. The computer workstation 136 controls the micro-imaging system 126 using control signals 138. The computer workstation 136 receives tile image data 140 from the micro-imaging system 126 and saves the tile image data 140 to memory, typically high capacity storage 142, such as a hard disk. Generally, the tile image data 140 is transmitted to the high capacity storage 142 and stored in a compressed format minimizing data transfer requirements between the computer workstation 136 and the high capacity storage 142 and, minimizing data storage requirements at the high capacity storage 142.

The stored tile images 134 are assembled into image-mosaics 144, each image-mosaic 144 representing a surface of interest of the die 120 at a deconstruction step 132. During acquisition of the tile images 134 of the die 120, a sample coordinate space 146 is defined. The sample coordinate space 146 is used to align the tile images 134 and the image-mosaics 144.

FIG. 2 is a process diagram showing an exemplary prior art progression of steps followed during the manufacture of an IC. The diagram shows a progression of cross-sections through a silicon substrate, representing exemplary steps in manufacturing a component such as a junction. In step 152 of the progression, the silicon substrate is doped using diffusion and/or ion implantation techniques to change its characteristics and, in particular, to form P-wells, well known in the art. In step 154, another implantation is performed to form N-type sources and drains. A gate oxide layer is deposited between the sources and drains, and a field oxide is deposited in other areas of the chip in step 156. A polysilicon gate layer is deposited in step 158, and in steps 160 and 162 the deposition of oxide layers is effected. Metal layers for providing connectivity between the gates, sources and drains are deposited in step 164. Step 166 illustrates the deposition of a passivation layer, typically used to protect the IC from physical damage and/or contamination with dust particles before it is encapsulated in step 122 (FIG. 1).

FIG. 3 is a process diagram showing an exemplary prior art progression of steps used to reverse-engineer a sample IC. Step 170 illustrates a cross-section through a silicon substrate of a die 120 after decapsulation in step 130 (FIG. 1). Steps 172, 174, 176, 178, 180 and 182 illustrate a progressive removal of the deposited material layers, such as the passivation layer, metalization layers, polysilicon layers, base contact layers, the field oxide layer, etc. This results in an exposed silicon substrate (step 182) including the well structures manufactured during steps 152 and 154 (FIG. 2). In order to reveal the well structure, the back surface of the die 120 may also be deconstructed. Steps 184 and 186 show the progressive deconstruction of the back surface of the die 120 to expose the P- and N-wells. In extracting design and layout information both surfaces of the die 120 may be micro-imaged, and therefore both represent surfaces of interest.

FIGS. 2 and 3 also show components spanning deposition layers, the surface of interest having a relief and traces that follow the relief.

Figure 4:
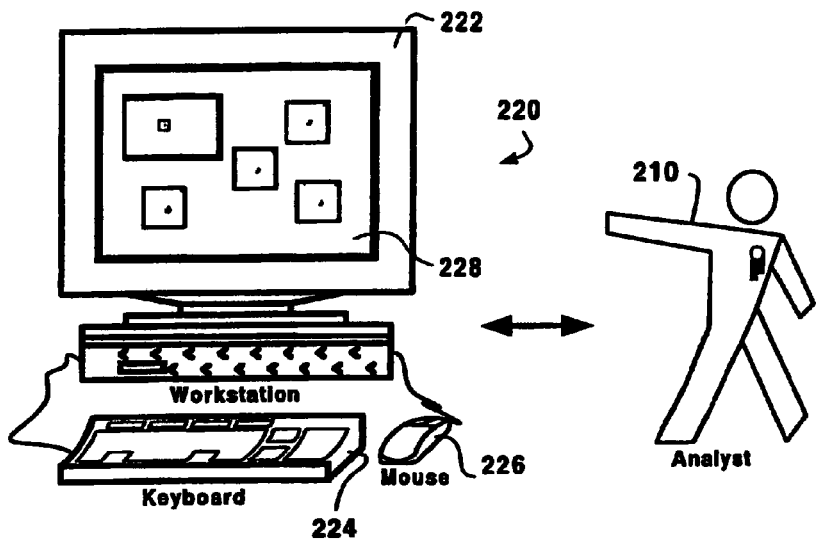
FIG. 4 is a schematic diagram showing a man-machine interface having a visual display for displaying multiple views and associated lock-step cursors in accordance with a preferred embodiment of the invention.

FIG. 4 shows a design analysis workstation 220 in accordance with the invention. The design analysis workstation 220 includes software applications that permit an engineer analyst 210 to reverse-engineer IC's using a pointing device 226 and a monitor 222, instead of using photographs, markers and paper. The design analysis workstation 220 functions as a reverse-engineering system that enables the engineer analyst 210 to reverse engineer a chip by annotating image-mosaics and performing design and layout display functions. A "chip" in the context of reverse-engineering of an IC, is a fundamental object used to organize data related to the integrated circuit under analysis. A chip includes a number of layers. Each layer corresponds to a physical interconnect layer on a physical IC. A layer is any one of one or more die photos, one or more image-mosaics and one or more annotation overlays.

As explained above with reference to FIG. 1, an image-mosaic 144 is an arrangement of a number of acquired tile images 134. The tile images 134 are of a higher magnification than that of a die photo, which is an image of the entire integrated circuit before deconstruction is begun. The tile images 134 abut together to form a large, seamless high-magnification image of the integrated circuit following a particular deconstruction step. Each image-mosaic 144 can be annotated using one or more annotation overlays, which will be described below with reference to FIG. 7.

In analyzing integrated circuits to extract design and layout information, an engineer analyst 210 utilizes the DAW 220, which has the visual display 222, a keyboard 224 and a pointing device 226, such as, but not limited to, a mouse. The visual display 222 has a display area 228 that defines a corresponding display coordinate space. A system pointer displayed in the display area 228 is controlled by the pointing device 226. The system pointer preferably has a distinctive shape, size and color.

The visual display 222 is typically a Cathode Ray Tube (CRT), a Liquid Crystal Display (LCD), an image projected by an image projector, or the like. Alternatively the display analysis workstation 220 may include a distributed visual display provided by a multi-headed visual display (not shown), a distributed windowing environment spanning visual displays 222 of a plurality of workstations 220, etc. Distributed windowing environments are commercially available from the XConsortium®, NeXTStep®/OpenStep®, etc.

In accordance with the invention, a plurality of engineer analysts 210 may operate a plurality of design analysis workstations 220 to extract design and layout information concurrently from shared image-mosaics 144 (FIG. 1), representative of a deconstructed integrated circuit. The system includes multi-user extensions to provide facilities for synchronizing work of multiple engineer-analysts 210 working on an IC reverse-engineering project, as is described below in more detail with reference to ownership of annotation objects.

Figure 5:
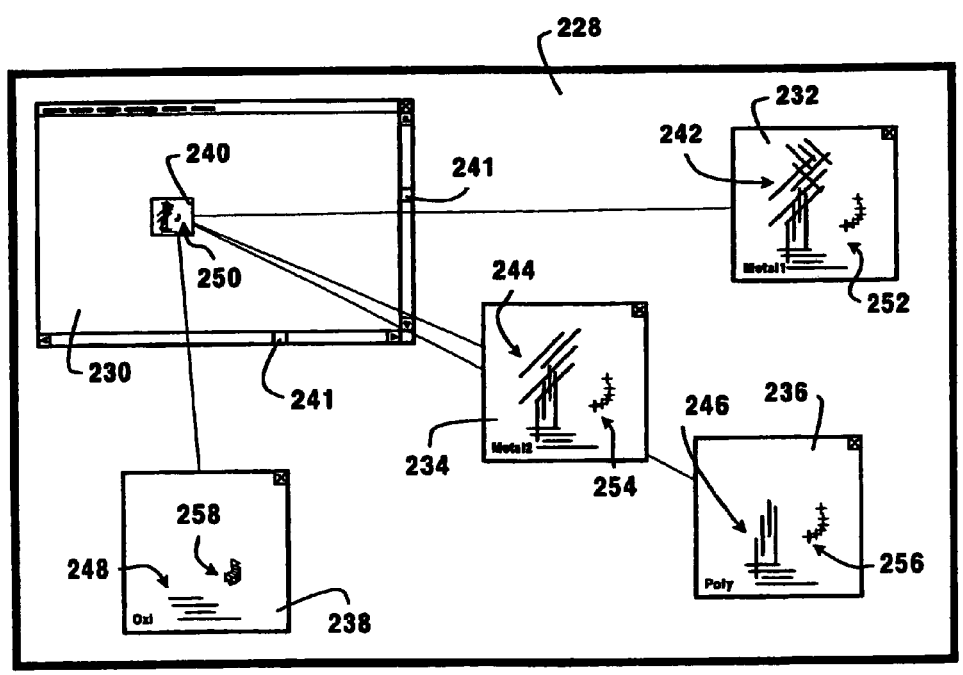
FIG. 5 is a schematic representation of a display area of the man-machine interface showing multiple views and lock-step cursors in accordance with the preferred embodiment of the invention.

FIG. 5 is a schematic diagram illustrating details of the display area of the design analysis workstation 220 shown in FIG. 4. The display area 228 displays a navigation window 230 and mosaic-views 232, 234, 236 and 238, each having a view-boundary. The navigation window 230 provides an overall view of the integrated circuit under analysis. The navigation window 230 displays a low magnification digital image of the integrated circuit. When the sample under analysis is a single IC die or a substantial portion thereof, the low magnification image displayed in the navigation window 230 is called a die photo. A slice 240 is selected in the navigation window 230 and defines an area-of-interest on the die photo. An exemplary process by which a slice is created is described in Applicant's co-pending U.S. patent application Ser. No. 09/604,252 filed 27 Jun. 2000 and entitled LOCK-STEP CURSORS FOR FEATURE ALIGNMENT which is incorporated herein by reference.

Mosaic-views 232, 234, 236 and 238 respectively display a portion of an image-mosaic obtained after a particular deconstruction step in the process of deconstructing the IC. The slice 240 defines an area-of-interest displayed in each mosaic-view 232–238.

Lock-step cursors 252, 254, 256 and 258 are displayed within reach mosaic-view, when appropriate. A corresponding lock-step cursor 250 may also be shown in the navigation window 230. Preferably the lock-step cursors are similar in shape, size and color, except for a master-cursor, shown at 258. The master-cursor 258 indicates a current location of the system pointer 250, controlled by the pointing device 226, when the system pointer is positioned within a mosaic-view. The master-cursor may have the same appearance as the system pointer, or may have a distinctive shape, size and/or color. Lock-step cursors 250, 252, 254, 256 and 258 move in unison under the control of the master-cursor because they share positional coordinates in the sample coordinate space with the master-cursor. The lock-step motion is shown in the diagrams as a trailing effect.

In accordance with a preferred embodiment of the invention, mosaic-views 232, 234, 236 and 238 zoom and/or pan in unison, subject to the slice 240 being zoomed or panned. For this purpose the navigation window 230 is shown to have panning sliders.

Figure 6:
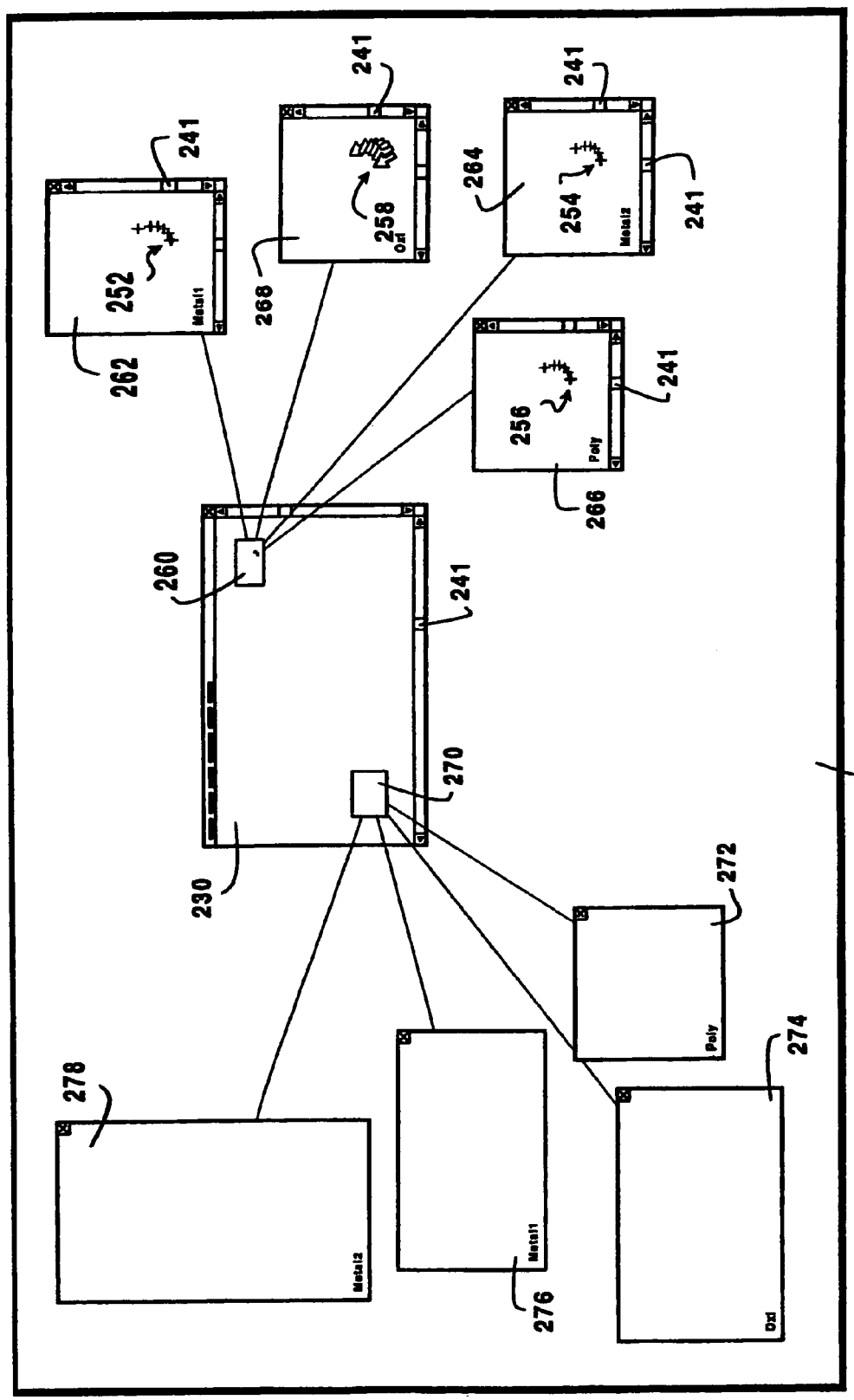
FIG. 6 is another schematic representation of the display area shown in FIG. 5, illustrating multiple views and lock-step cursors in accordance with another embodiment of the invention.

FIG. 6 is another schematic diagram of the display area 228 of the design analysis workstation 220 in accordance with another embodiment of the invention. A slice 260 is shown to have associated mosaic-views 262, 264, 266 and 268. In accordance with this embodiment, all mosaic-views zoom or pan as any one of the mosaic-views is zoomed or panned. To accommodate this, each of the mosaic-views 262, 264, 266 and 268 is provided with panning sliders 241. The navigation window 230 is also shown to have another slice 270 defined. Slice 270 is associated with mosaic-views 272, 274, 276 and 278. In accordance with this embodiment of the invention, mosaic-views 272, 274, 276 and 278 are shown to have dissimilar sizes and each may be resized and zoomed independently.

FIG. 7 is a schematic representation of a mosaic-view showing the selection of an annotation overlay to be displayed therein in accordance with an exemplary embodiment of the invention. With the master-cursor 258 inside a mosaic-view such as 266, an interactive event 300 such as a mouse click, a key sequence activation, or the like, is performed. In response, an annotation overlay selection menu 302 is displayed. The annotation overlay selection menu 302 provides a list of annotation overlays associated with the chip under analysis and one of the annotation overlays 304 can be selected. As shown, any annotation overlay can be displayed over any image-mosaic to extract design and layout information therefrom by drawing annotation objects on the annotation overlay.

An annotation object is an entity drawn by an engineer analyst 210 on an annotation overlay based on features inferred from at least one image-mosaic 144 displayed in at least one mosaic-view 262–266. The image-mosaics are the source images. An image-mosaic 144 forms the background of each mosaic-view 262–266. Examples of annotation objects include rectangles, lines, polygons, ovals, text labels, contacts and wires. Annotations can be loaded and saved independently of the image-mosaics 144.

FIG. 8 is a schematic diagram illustrating a the creation of an annotation object in accordance with an embodiment of the invention. The mosaic-view 262 is displayed over an image-mosaic derived from a deconstruction step of the integrated circuit that exposed a metal1 layer. Metal1 traces 310 and 312 are observable at a current pan and zoom factor. An annotation object 322 is created based on the observed features of trace 310. Once created, the annotation object 322 overlays the trace 312.

As mentioned above facilities are provided for multi-view editing. An edit operation can be started in one mosaic-view and continued, including its completion, in another mosaic-view. Multi-view editing facilitates the drawing of very long annotation objects, such as bus lines on the integrated circuit, without scrolling mosaic-views. In multi-view editing the image-mosaics 144 need not be associated with the same deconstruction step.

Edit operations performed between mosaic-views are preferably subject to the following rules:

a. an annotation object is associated with the annotation overlay displayed in the mosaic-view 262 in which the edit operation started; and b. moving or copying an annotation object associates the annotation object with the annotation overlay displayed in the mosaic-view 262 in which the edit operation ended.

In accordance with the invention, at least the mosaic-view 262 associated with the master-cursor 258 may have a toolbar for retrieving common annotation objects. The toolbar may permit an engineer analyst 210 to retrieve simple or complex annotation objects, each annotation object representing one or more components of an integrated circuit. As shown in FIG. 8, the mosaic-view 262 includes a toolbar 320.

Annotation objects can be manipulated together by selecting a set of annotation objects and invoking an operator. The toolbar 320 may also include select-and-click access to operators for performing operations on selected annotation objects. The operators for performing operations on annotation objects may be primitive or complex. Facilities for defining complex operators may also be provided. Using the operators, annotation objects can be deleted, edited, moved, rotated, mirrored, resized, etc. A facility is also preferably provided for undoing and redoing operations. Annotation objects can be hidden to prevent inadvertent editing thereof, but hidden objects may be selected and brought to the foreground. Annotation objects can also be locked to prevent editing. Locked objects may be selected and unlocked to enable editing.

To facilitate manipulation, annotation objects can be grouped into annotation object groups. The annotation-objects can be grouped hierarchically, that is an annotation object group may include one or more constituent annotation object group(s). The annotation object groups can be selected and ungrouped at any time. FIG. 9 is a schematic diagram illustrating grouped annotation objects in accordance with an exemplary embodiment of the invention. Annotation objects 324, 326 and 328 created using polygon primitives are grouped together as an annotation object group 330. The grouping of annotation objects into annotation object groups enables cell/component specification and extraction. A cell is an annotation object group that has been given a name. Typically, cells are used to represent components or small circuits such as logic gates, flip-flops, etc.

FIG. 10 is a schematic diagram illustrating a component cell created using the design analysis workstation 220 in accordance with an embodiment of the invention. A component cell 340 corresponding to the annotation object group 330 shown in FIG. 9 represents a transistor Q1. A cell may be assigned properties by the engineer analyst 210. Cell properties may include specification of at least one port. Each port is assigned a signal directionality such as: input signaling, output signaling and bi-directional signaling. FIG. 10 also illustrates the connection between cell ports 344, 346, 348 and annotation objects 324, 326, 328. The invention also provides facilities for the creation of cell libraries. A cell library is a collection of cells used for the analysis of ICs.

Annotation objects have attributes. Each annotation object includes predefined attributes specifying information related to the annotation object. Selected attributes are editable. The annotation object attributes include: hollow/filled, solid fill/stippled fill, fill color, border color, border width, text label angle, text font, text color, etc. The polygons can be a set of straight lines or Bezier curves, or combinations of the two.

Wires and contacts are special annotation objects having layer attributes used to represent interconnect entities. Wires and contacts also have signal carrying characteristics. Wire annotation objects have an associated layer attribute that specifies the layer of an integrated circuit on which the wire is located. The layer associated with a wire annotation object may be different from the image-mosaic from which the information for creating the wire annotation object was inferred.

FIGS. 11A and 11B are schematic diagrams illustrating two mosaic-views each displaying connected wire annotation objects in accordance with an embodiment of the invention. The short angled lines represent edges of an integrated circuit on which the wire annotation objects were overlaid. Two wire annotation objects 382 and 384 respectively specify layer attributes indicating that the annotation object 382 is located on Metal2 layer and annotation object 384 is located on Metal1 layer. A contact annotation 388 represents an electrical contact between two or more components. Contacts between components are preferably represented as circles or crosses. Each contact has two layer attributes. The contact 388 shown in FIGS. 11A and 11B has its associated layer attributes set to Metal1 layer and Metal2 layer.

FIG. 12 is a flow diagram showing a process in accordance with an embodiment of the invention for labeling wire annotation objects. The wire annotation labeling process is started in step 400 when a wire annotation object labeling operation is invoked for a wire annotation object.

If a selected wire annotation object has a signal property (step 402), a wire label is created in step 404 and the wire annotation object labeling process ends in step 406.

If it is determined in step 402 that the wire annotation object does not have a signal property, the design analysis workstation 220 searches attributes of annotation objects and/or cells connected to the selected wire annotation object (step 408) to determine their respective signal properties. If an unambiguous signal property can be determined (step 410), then the signal property is propagated to all connected components in step 412 and a wire annotation object label is generated in step 404. Otherwise, the engineer analyst 210 is prompted in step 414 for a signal label to be propagated to the connected components. In step 416, input from the engineer analyst 210 specifying the signal label is accepted.

Another embodiment of the design analysis workstation 220 in accordance with the invention provides a facility for automatically labeling annotation objects on creation. The labels may be numerical or text labels, for example. In an embodiment of the invention in which an IC is analyzed concurrently by a plurality of engineer analysts 210 using a plurality of design analysis workstations 220, the facility for automatic labeling provides globally unique labeling suffixes to ensure that labeling conflicts do not arise.

The design analysis workstation 220 also includes a facility for performing measurements. The measurement utilities include facilities for obtaining linear measurements, such as distances between components, trace widths, etc. Area measurements that specify the area covered by a polygonal component may also be obtained. FIG. 11A shows at 392 the trace width of the wire annotation object 382 and at 390 the area of the contact 388.

Annotation objects can also be associated with annotation object properties. Arbitrary information can be added to annotation objects using annotation object properties. An annotation object property is a key-value pair, where the key and the value are arbitrary strings of characters. Each annotation object can have any number of associated annotation object properties.

Annotation objects may also be organized in annotation object groups. Annotation object groups may have attributes and properties. The annotation object group attributes and properties may have an overriding effect on selected attributes and properties of the constituent annotation objects in an annotation object group. An annotation object group has editable attributes that permit the specification of repeating structures, arrayed components and arrayed cells. An example of a repeating structure is a signal bus. Memory cells are an example of arrayed cells. The design analysis workstation 220 also provides a facility for displaying attributes and properties associated with annotation objects and annotation object groups.

FIG. 9 also illustrates the display of information relating to grouped annotation objects in accordance with an embodiment of the design analysis workstation 220 in accordance with the invention. Pop-up windows 325 and 331 respectively display attribute and property information related to annotation object 324 and annotation object group 330. The pop-up windows 325 and 331 may be displayed by the design analysis workstation 220 in response to an interactive event, such as a mouse-click, a key press, an activation of a menu selection, etc. The pop-up windows may be transient or may be configured to persist, pending an action by the engineer analyst 210 to close the window(s).

The design analysis workstation 220 provides an engineer analyst 210 with a facility for selecting annotation objects based on criteria related to attributes and/or properties associated with an annotation object or an annotation object group. Criteria based selection of annotation objects or object groups is optionally subject to recursive searches. If so, recursive searches parse annotation object constituents of annotation object groups. Recursive searching through constituents of annotation object groups may be suppressed. Criteria based searches can be logically combined and selection criteria for annotation objects can be manipulated using boolean logic.

The design analysis workstation 220 also provides a facility for panning or zooming onto annotation objects selected using criteria-based searches. Labels corresponding to annotation objects selected using a criteria-based search may be displayed in a search result view. The activation of the pan or zoom facility is preferably activated by double clicking on annotation objects listed in a search result view.

The design analysis workstation 220 enables recursive editing of annotation objects and annotation object groups. Recursive editing includes suspending an edit operation to start or perform another operation. For example, a mosaic-view 262 may be panned or zoomed during an edit operation. A benefit derived from recursive editing is the ability to save annotation objects to permanent storage in the middle of an edit operation. Preferably recursive edits may be nested indefinitely, subject to available resources.

Figure 13:
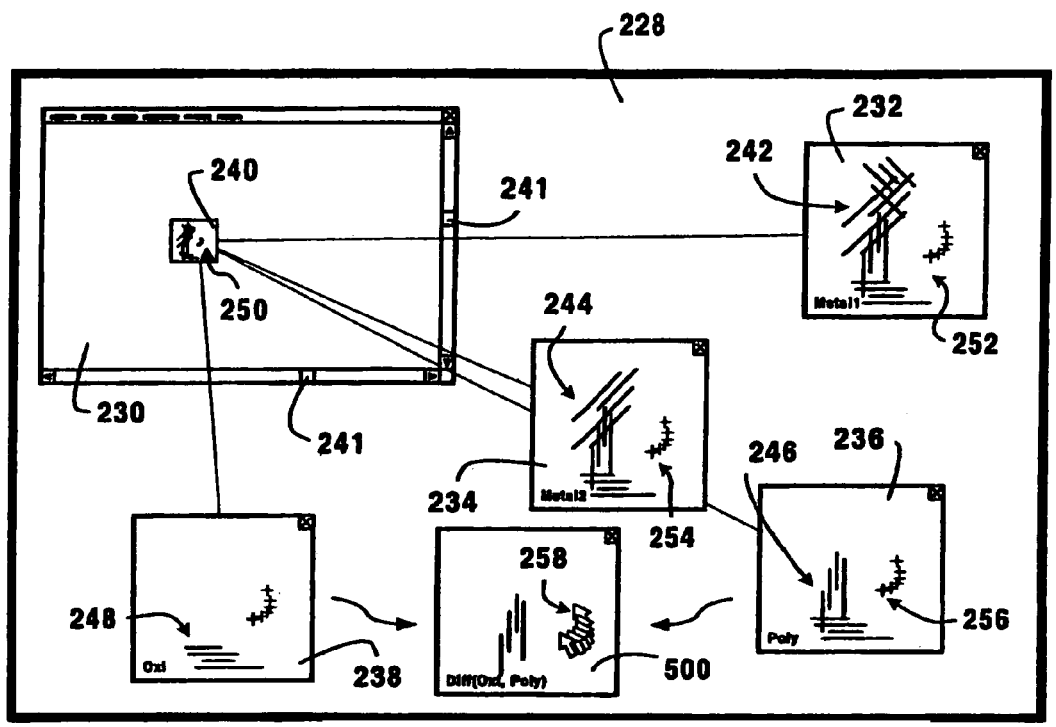
FIG. 13 is another schematic representation of the display area of the man-machine interface illustrating an image-mosaic combination view for comparison of image-mosaics.

FIG. 13 is a schematic representation of the display area of the design analysis workstation 220, illustrating an image-mosaic comparison view 500 derived from combined portions of image-mosaics 238 (oxide layer) and 236 (polysilicon layer) of a slice 240 The image-mosaic comparison view 500 is derived by selecting two or more mosaic-views of interest. The design analysis workstation derives two "snapshots" from the respective mosaic-views 236, 238. The snapshots are combined in the image-mosaic comparison.

A no operation (NoOp) combination is a simple combination of selected mosaic-views. An Add combination of two snapshots performs a pixel-by-pixel addition of the pixel intensities of each of the selected mosaic-views. The Add combination is used for overlaying image-mosaics captured at the same location on any integrated circuit during different deconstruction steps. A FirstMinusSecond display of the two snapshots performs a pixel-by-pixel subtraction of the pixel intensities of the second snapshot from the pixel intensities of the first snapshot. The image-mosaic comparison view 500 is a FirstMinusSecond combination of the mosaic-views 238 and 236. The common structure 248 is subtracted from the image comparison mosaic-view 500. A SecondMinusFirst combination of the two snapshots performs a pixel-by-pixel subtraction of the pixel intensities of the first snapshot from the pixel intensities of the second snapshot. Dissimilar intensity areas show up as light or dark regions. Areas with similar pixel values in both snapshots produce in a dull gray appearance in the image-mosaic comparison view.

In an AbsoluteDifference combination, the pixel intensities are subtracted pixel-by-pixel and then an absolute value is used. The result is a contrast-stretched to cover the full brightness range. This is very useful for inspecting small differences in otherwise similar areas e.g. if areas of similarity are dark, the differences are bright in an AbsoluteDifference combination image-mosaic comparison view.

An Interweave combination useful for combining two portions of image mosaics of the same area, but on different layers. The pixels of the two snapshots are interleaved in a checkerboard pattern. The Interweave combination has a function similar to the Add combination, and improves on brightness and color fidelity at the expense of pixel resolution.

A Flip combination is also provided. The Flip combination is used to display two or more snapshots alternately. The alternating display of the snapshots can be repeated at a selected repetition interval so that the differences stand out as "moving" features.

Integrated circuit design includes mirrored structures. In order to obtain a useful combination of snapshots a mirror function is provided to permit mirrored structures to be overlaid in a mirrored orientation so that differences, if any, are readily observed. The image processing window preferably displays a lock-step cursor, and the motion of the lockset cursor preferably takes mirroring into account.

As mentioned above, a plurality of engineer analysts 210 may collaborate in extracting design and layout information from a chip using the design analysis workstation 210 in accordance with the invention. Facilities are therefore provided to assist in parallel design and layout extraction.

Certain basic features are required in the design analysis workstation 220 to accommodate parallel design and layout extraction. Those features include annotation ownership tracking, unique annotation label generation, annotation locking and annotation merging. These facilities represent only the basic functionality required for collaborative design analysis.

Annotation ownership tracking keeps track of an identification of the engineer analyst 210 who created each annotation and only permits modifications thereof by the creator. Unique annotation label generation ensures that each identifier generated is unique across the project, even if several engineer analysts 210 are working on a project simultaneously. Annotation locking enables a creator of an annotation to "lock" an annotation object thus preventing editing by others of the annotation object to prevent accidental modifications. Annotation merging enables the loading of annotation objects owned by other engineer analysts 210.

Figure 14:
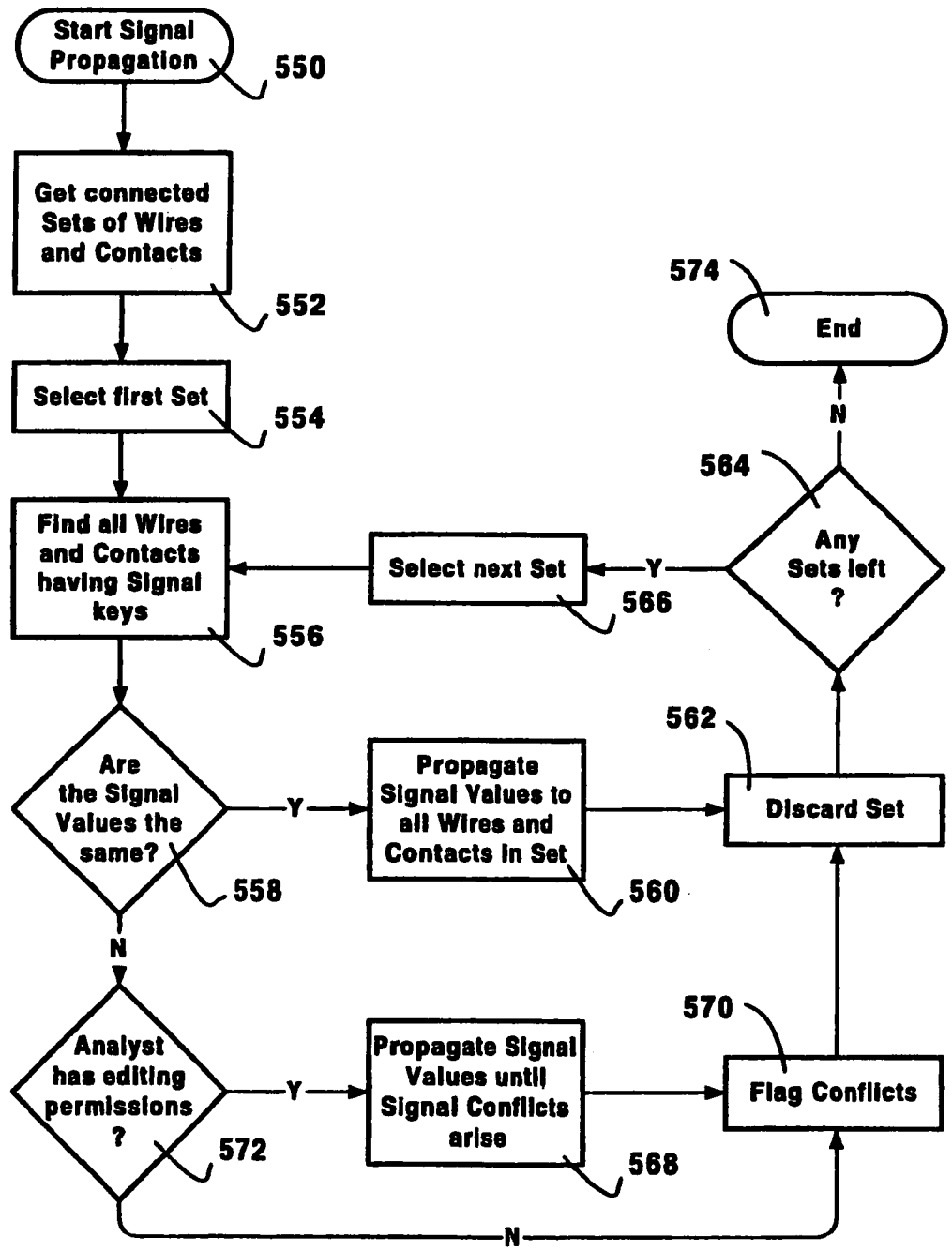
FIG. 14 is a flow diagram showing a process of propagating signal information to connected components in accordance with an exemplary embodiment of the invention.

The design analysis workstation 220 also provides a facility for the propagation of signal information between components connected by wire and/or contact annotation objects. Each wire and contact annotation object has a property with a signal key. The signal key represents the name of the signal that the associated wire or contact carries. FIG. 14 is a flow diagram showing a process for propagating signal information to connected components performed by the design analysis workstation 220 in accordance with an embodiment of the invention. The signal propagation process begin at step 550, followed by a search (step 552) for all connected sets of wire annotation objects and contact annotation objects associated with a particular integrated circuit. A first of the sets is selected in step 554, and annotation objects in that set which have a signal property are located in step 556. If the signal specifications of all annotation objects found in step 556 have the same signal value (as ascertained in step 558), the signal value is propagated in step 560 to all annotation objects in the connected set. The set is discarded in step 562 and if there are any other sets left to process (step 564) another set is selected in step 566 and the process resumes from step 556.

If the connected set of annotations objects has two or more different signal values (step 558), an attempt is made to propagate the signals until conflicts arise (step 568). The conflicts are flagged for display (step 570) and further investigation by the engineer analyst 210. Signal conflicts indicate electrical shorts, which normally point to errors in the design analysis.

The design analysis workstation 220 provides a facility for browsing and inspecting signal conflicts. The facility may include a pop-up view with at least one signal conflict location displayed therein. Navigation buttons are preferably provided for browsing and inspecting the conflicts. All signal conflict flags have certain properties attached. Those properties include a property having an "error" key with a "short" value. Properties having a "signal" key and a "signal label" value are created for each conflicting signal. The labels of the annotation objects specifying the conflicting signals may also be specified by an engineer analyst 210 using the design analysis workstation 220. Propagation of signals may be prevented by locked annotation objects (step 572) created by a different engineer analyst 210. In such cases signal conflicts are preferably flagged, but the signal values are not propagated.

Figure 15A:
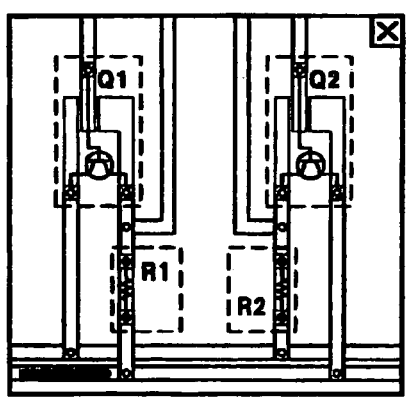
FIGS. 15A and 15B, which appear on sheet seven of the drawings, are schematic diagrams illustrating the generation of a net-list from interconnected annotation objects in accordance with an exemplary embodiment of the invention.
Figure 15B:
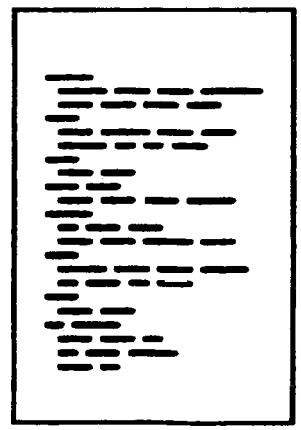

The design analysis workstation 210 also provides a facility for extracting design information from interconnected annotation objects. The extraction of design information is used to generate a net-list of components and connections. Net-lists are well known in the art. FIGS. 15A and 15B are schematic diagrams illustrating the generation of a net-list from interconnected annotation objects on an annotation overlay shown in FIG. 15A. Generating the net-list produces a net-list document shown in FIG. 15B.

The embodiments of the invention described above are intended to be exemplary only. The scope of the invention is therefore intended to be limited solely by the scope of the appended claims.

I claim:

1. A system for extracting design and layout information from a plurality of image-mosaics representative of a deconstructed integrated circuit, the system comprising facilities enabling parallel design analysis of the image-mosaics by a plurality of engineer analysts concurrently reverse engineering an integrated circuit (IC), the facilities including: annotation ownership tracking which assigns an ownership attribute that specifies an engineer analyst associated with the design analysis workstation at a time when the annotation object was created; unique annotation label generation which generates unique labels to ensure that each annotation label generated is unique across an IC analysis project; annotation locking which permits a creator of an annotation to prevent other engineer anaysts from changing the annotation object; and, annotation merging which permits an engineer analyst to load an annotation object owned by another engineer analyst.

2. The system as claimed in claim 1, wherein the system permits the plurality of image-mosaics to be annotated concurrently using a plurality of design analysis workstations.

3. The system as claimed in claim 2, wherein each annotation object created using a design analysis workstation participating in parallel design analysis is provided an ownership attribute by the ownership tracking facility, the ownership attribute specifying an engineer analyst associated with the design analysis workstation at a time when the annotation object was created.

4. The system as claimed in claim 3, wherein the unique annotation label generation facility generates a unique identification string for each annotation objects created using the design analysis workstation.

5. The system as claimed in claim 3, wherein the annotation merging facility merges annotation objects having different ownership attributes for display on one design analysis workstation.

6. The system as claimed in claim 1 wherein the annotation locking facility permits a creator of an annotation object to lock the annotation object to prevent editing of the annotation object by others while the annotation object is locked, so that accidental modification of the annotation object is prevented.

7. The system as claimed in claim 1 wherein the system propagates signal information between components connected by wire and contact annotation objects, each wire and contact annotation object having a property with a signal key and the signal key represents a name of a signal that the associated wire or contact carries, and the facilities prevent propagation of signals by locked annotation objects created by another engineer analyst, but the facilities flag signal conflicts even tough the signals are not propagated.

8. A method of extracting design and layout information from a plurality of image-mosaics representative of a deconstructed integrated circuit the method comprising enabling parallel design analysis of the image-mosaics by a plurality of engineer analysts concurrently reverse engineering an integrated circuit (IC) using multi-user extensions to provide facilities to synchronize work of multiple engineer-analysts working on an IC reverse-engineering project, the facilities enabling parallel design analysis of the image-mosaics by a plurality of engineer analysts concurrently reverse engineering an integrated circuit (IC), including: annotation ownership tracking which assigns an ownership attribute that specifies an engineer analyst associated with the design analysis workstation at a time when the annotation object was created; unique annotation label generation which generates unique labels to ensure that each annotation label generated is unique across an IC analysis project; annotation locking which permits a creator of an annotation to prevent other engineer anaysts from changing the annotation object; and annotation merging which permits an engineer analyst to load an annotation object owned by another engineer analyst.

9. The method as claimed in claim 8, wherein annotation ownership tracking comprises providing ownership attributes for specifying an engineer analyst associated with a design analysis workstation at a time when the annotation object is created.

10. The method as claimed in claim 9, wherein unique annotation label generation comprises generating a unique identification string for each annotation object.

11. The method as claimed in claim 9, wherein annotation merging comprises merging annotation objects having different ownership attributes for display on one design analysis workstation.

12. The method as claimed in claim 9 wherein annotation locking comprises preventing editing of annotation objects by permitting a creator of an annotation object to lock the annotation object to prevent editing of the annotation object by others while the annotation object is locked.

13. The method as claimed in claim 12 further comprising providing facilities that propagate signal information between components connected by wire and contact annotation objects, each wire and contact annotation object having a property with a signal key that represents a name of a signal that the associated wire or contact carries, and preventing propagation of signals by locked annotation objects created by another engineer analysts, while flagging all signal conflicts even though the signals are not propagated.

* * * * *